United States Patent
Chen

(10) Patent No.: US 12,316,105 B2
(45) Date of Patent: May 27, 2025

(54) INTERFERENCE FILTER AND ELECTROSTATIC DISCHARGE / ELECTRICAL SURGE PROTECTION CIRCUIT AND DEVICE

(71) Applicant: SEMICONDUCTOR COMPONENTS INDUSTRIES, LLC, Phoenix, AZ (US)

(72) Inventor: Yupeng Chen, San Jose, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 252 days.

(21) Appl. No.: 17/804,692

(22) Filed: May 31, 2022

(65) Prior Publication Data

US 2022/0399717 A1     Dec. 15, 2022

Related U.S. Application Data

(60) Provisional application No. 63/202,462, filed on Jun. 11, 2021.

(51) Int. Cl.
*H02H 9/04* (2006.01)
*H01L 23/552* (2006.01)
(Continued)

(52) U.S. Cl.
CPC .......... *H02H 9/046* (2013.01); *H01L 23/552* (2013.01); *H03H 7/0138* (2013.01); *H03H 7/1766* (2013.01); *H10D 89/60* (2025.01)

(58) Field of Classification Search
None
See application file for complete search history.

(56) References Cited

U.S. PATENT DOCUMENTS 4,443,662 A * 4/1984 Nakhla ................ H04M 11/062
                                                            333/32
5,148,250 A * 9/1992 Winnerl .............. H01L 27/0248
                                                            257/361
(Continued)

FOREIGN PATENT DOCUMENTS

CN          1901192 A       1/2007
KR      20070038412 A       4/2007

OTHER PUBLICATIONS

European Patent Office, "European Search Report," Application No. 22177826.9-1020, Nov. 2, 2022.

*Primary Examiner* — Thomas J. Hiltunen
(74) *Attorney, Agent, or Firm* — Brake Hughes Bellermann LLP

(57) ABSTRACT

In some aspects, the techniques described herein relate to an electromagnetic interference (EMI) filter circuit including: an input terminal; an output terminal; an electrical ground terminal; a resistor electrically coupled between the input terminal and the output terminal; a first bipolar transistor including: a collector terminal electrically coupled with the input terminal; an emitter terminal electrically coupled with the electrical ground terminal; and a base terminal that is electrically floating; and a second bipolar transistor including: a collector terminal electrically coupled with the output terminal; an emitter terminal electrically coupled with the electrical ground terminal; and a base terminal that is electrically floating.

20 Claims, 6 Drawing Sheets

(51) Int. Cl.
  *H03H 7/01* (2006.01)
  *H10D 89/60* (2025.01)

(56) References Cited

U.S. PATENT DOCUMENTS

| | | | | |
|---|---|---|---|---|
| 5,663,678 | A * | 9/1997 | Chang | H01L 27/0266 |
| | | | | 327/566 |
| 6,304,423 | B1 * | 10/2001 | Long | H01L 27/0288 |
| | | | | 361/111 |
| 6,600,356 | B1 * | 7/2003 | Weiss | H01L 27/0259 |
| | | | | 327/310 |
| 7,262,681 | B2 * | 8/2007 | Hurley | H03H 7/0107 |
| | | | | 336/200 |
| 7,391,082 | B2 * | 6/2008 | Shin | H01L 27/0629 |
| | | | | 257/E27.047 |
| 8,008,723 | B2 * | 8/2011 | Nagai | H01L 27/0259 |
| | | | | 257/E29.166 |
| 8,513,738 | B2 * | 8/2013 | Campi, Jr. | H01L 29/41775 |
| | | | | 438/179 |
| 8,879,223 | B2 * | 11/2014 | Wang | H02H 9/045 |
| | | | | 361/56 |
| 8,896,093 | B2 * | 11/2014 | Mallikararjunaswamy | |
| | | | | H01L 21/02365 |
| | | | | 257/539 |
| 2008/0121988 | A1 | 5/2008 | Mallikarjunaswamy et al. | |
| 2014/0211348 | A1 | 7/2014 | Wang et al. | |
| 2015/0002968 | A1 | 1/2015 | Wang et al. | |
| 2018/0286852 | A1 | 10/2018 | Mallikarjunaswamy et al. | |

* cited by examiner

INTERFERENCE FILTER AND ELECTROSTATIC DISCHARGE / ELECTRICAL SURGE PROTECTION CIRCUIT AND DEVICE

RELATED APPLICATION

This application claims priority to and the benefit of U.S. Provisional Application No. 63/202,462, filed Jun. 11, 2021, which is incorporated herein by reference in its entirety.

TECHNICAL FIELD

This disclosure relates to circuits, such as circuits that can be implemented in a semiconductor device. More specifically, this disclosure relates to circuits and devices for providing linear electromagnetic interference filtering, as well as protection from electrostatic discharge and/or electrical surge events.

BACKGROUND

Semiconductor processing technologies, and related packaging technologies continue to scale to smaller dimensions. Additionally, semiconductor devices produced using such technologies can be included in systems with increased performance requirements, such as speed of operation. For instance, electromagnetic interference (EMI) filter devices implemented in mobile device technologies, such as fifth-generation (5G) wireless technologies, can be subjected to increasing EMI levels, e.g., due to increased radio frequency (RF) of operation and/or additional antennas being added, as compared to previous devices. Furthermore, scaling to smaller technologies also presents challenges in meeting electrostatic discharge (ESD) and electrical (voltage and/or current) surge protection target specifications. Current protection approaches cannot achieve sufficient ESD and electrical surge protection, while maintaining desired linearity and EMI attenuation performance in such EMI filter devices.

SUMMARY

In some aspects, the techniques described herein relate to an electromagnetic interference (EMI) filter circuit including: an input terminal; an output terminal; an electrical ground terminal; a resistor electrically coupled between the input terminal and the output terminal; a first bipolar transistor including: a collector terminal electrically coupled with the input terminal; an emitter terminal electrically coupled with the electrical ground terminal; and a base terminal that is electrically floating; and a second bipolar transistor including: a collector terminal electrically coupled with the output terminal; an emitter terminal electrically coupled with the electrical ground terminal; and a base terminal that is electrically floating.

In some aspects, the techniques described herein relate to a EMI filter circuit, wherein the resistor is a first resistor, the EMI filter circuit further including: a second resistor electrically coupled in series with the first resistor between the input terminal and the output terminal; and a third bipolar transistor including: a collector terminal electrically coupled between the first resistor and the second resistor; an emitter terminal electrically coupled with the electrical ground terminal; and a base terminal that is electrically floating.

In some aspects, the techniques described herein relate to a EMI filter circuit, wherein: the EMI filter circuit is included in a semiconductor device; the first bipolar transistor is a first vertical bipolar transistor; the second bipolar transistor is a second vertical bipolar transistor; and the third bipolar transistor is a third vertical bipolar transistor.

In some aspects, the techniques described herein relate to a EMI filter circuit, further including: an inductive-capacitive (LC) circuit including: an inductor; and a capacitor electrically coupled in parallel with the inductor, the LC circuit being electrically coupled in series with the resistor between the input terminal and the output terminal.

In some aspects, the techniques described herein relate to a EMI filter circuit, wherein the resistor is a first resistor and the LC circuit is a first LC circuit, the EMI filter circuit further including: a second resistor; and a second LC circuit, the first resistor, the first LC circuit, the second LC circuit, and the second resistor being electrically coupled in series between the input terminal and the output terminal, the EMI filter circuit further including: a third bipolar transistor including: a collector terminal electrically coupled between the first LC circuit and the second LC circuit; an emitter terminal electrically coupled with the electrical ground terminal; and a base terminal that is electrically floating.

In some aspects, the techniques described herein relate to a EMI filter circuit, wherein the resistor is a first resistor, the EMI filter circuit further including: a second resistor electrically coupled in series with the first resistor between the input terminal and the output terminal.

In some aspects, the techniques described herein relate to a EMI filter circuit, wherein: the EMI filter circuit is included in a semiconductor device; the first bipolar transistor is a first vertical bipolar transistor; the first resistor is a first diffusion resistor; the second bipolar transistor is a second vertical bipolar transistor; and the second resistor is a second diffusion resistor.

In some aspects, the techniques described herein relate to a semiconductor device including: a substrate of a first conductivity type; a semiconductor layer of a second conductivity type that is opposite the first conductivity type; a first isolation region defined by a first trench; a first diffusion region of the first conductivity type disposed in the semiconductor layer in the first isolation region; a second isolation region defined by a second trench; a second diffusion region of the first conductivity type disposed in the semiconductor layer in the second isolation region; an electrical ground terminal disposed on the semiconductor layer outside the first isolation region and outside the second isolation region; and an electromagnetic interference (EMI) filter circuit including: an input terminal disposed on the semiconductor layer in the first isolation region; an output terminal disposed on the semiconductor layer in the second isolation region; a first electrical impedance element disposed in the first isolation region; a second electrical impedance element disposed in the second isolation region, the first electrical impedance element and the second electrical impedance element being electrically coupled in series between the input terminal and the output terminal; a first vertical bipolar transistor disposed in the first isolation region, the first vertical bipolar transistor including: a collector terminal electrically coupled with the input terminal; an emitter terminal electrically coupled with the electrical ground terminal; and a base terminal that is electrically floating; and a second vertical bipolar transistor disposed in the second isolation region, the second vertical bipolar transistor including: a collector terminal electrically coupled with the output terminal; an emitter terminal electrically coupled with the electrical ground terminal; and a base terminal that is electrically floating.

In some aspects, the techniques described herein relate to a semiconductor device, wherein: the first trench extends from an upper surface of the semiconductor layer, through the semiconductor layer and terminates in the substrate, the first trench having a dielectric material disposed therein; and the second trench extends from the upper surface of the semiconductor layer, through the semiconductor layer and terminates in the substrate, the second trench having the dielectric material disposed therein.

In some aspects, the techniques described herein relate to a semiconductor device, wherein the electrical ground terminal is electrically coupled with the substrate via a plurality of trenches filled with an electrically conductive material.

In some aspects, the techniques described herein relate to a semiconductor device, wherein the plurality of trenches extend from a surface of the semiconductor layer, through the semiconductor layer and terminate in the substrate.

In some aspects, the techniques described herein relate to a semiconductor device, wherein: the first electrical impedance element is a first diffusion resistor included in the first diffusion region; and the second electrical impedance element is a second diffusion resistor included in the second diffusion region.

In some aspects, the techniques described herein relate to a semiconductor device, wherein: the collector terminal of the first vertical bipolar transistor is included in the first diffusion region; the base terminal of the first vertical bipolar transistor is included in the semiconductor layer; the emitter terminal of the first vertical bipolar transistor is included in the substrate; the collector terminal of the second vertical bipolar transistor is included in the second diffusion region; the base terminal of the second vertical bipolar transistor is included in the semiconductor layer; and the emitter terminal of the second vertical bipolar transistor is included in the substrate.

In some aspects, the techniques described herein relate to a semiconductor device, wherein: the first electrical impedance element is a resistor; and the second electrical impedance element is an inductive-capacitive (LC) circuit.

In some aspects, the techniques described herein relate to a semiconductor device, wherein the first diffusion region includes: a first region disposed in the semiconductor layer, the first region having a first doping concentration; and a second region disposed in the first region, the second region having a second doping concentration that is greater than the first doping concentration.

In some aspects, the techniques described herein relate to a semiconductor device, wherein: the first conductivity type is n-type; and the second conductivity type is p-type.

In some aspects, the techniques described herein relate to a method including: receiving an electrical transient at one of an input terminal, an output terminal, or an electrical ground terminal of an electromagnetic interference (EMI) filter circuit; clamping a voltage of the electrical transient with a vertical, open-base bipolar transistor of the EMI filter circuit; conducting a first portion of a current of the electrical transient with the vertical, open-base bipolar transistor; and conducting a second portion of the current of the electrical transient with an electrical impedance element of the EMI filter circuit, the second portion of the current being less than the first portion of the current, a collector terminal of the vertical, open-base bipolar transistor being electrically coupled with one of the input terminal or the output terminal, an emitter terminal of the vertical, open-base bipolar transistor being electrically coupled with the electrical ground terminal, and the electrical impedance element being electrically coupled between the input terminal and the output terminal.

In some aspects, the techniques described herein relate to a method, wherein the electrical transient is one of an electrostatic discharge (ESD) or an electrical surge.

In some aspects, the techniques described herein relate to a method, wherein the electrical impedance element includes at least one of a diffusion resistor or an inductive-capacitive circuit.

In some aspects, the techniques described herein relate to a method, wherein the vertical, open-base bipolar transistor and the electrical impedance element are included in an isolation region of the EMI filter circuit.

Figure 1A:
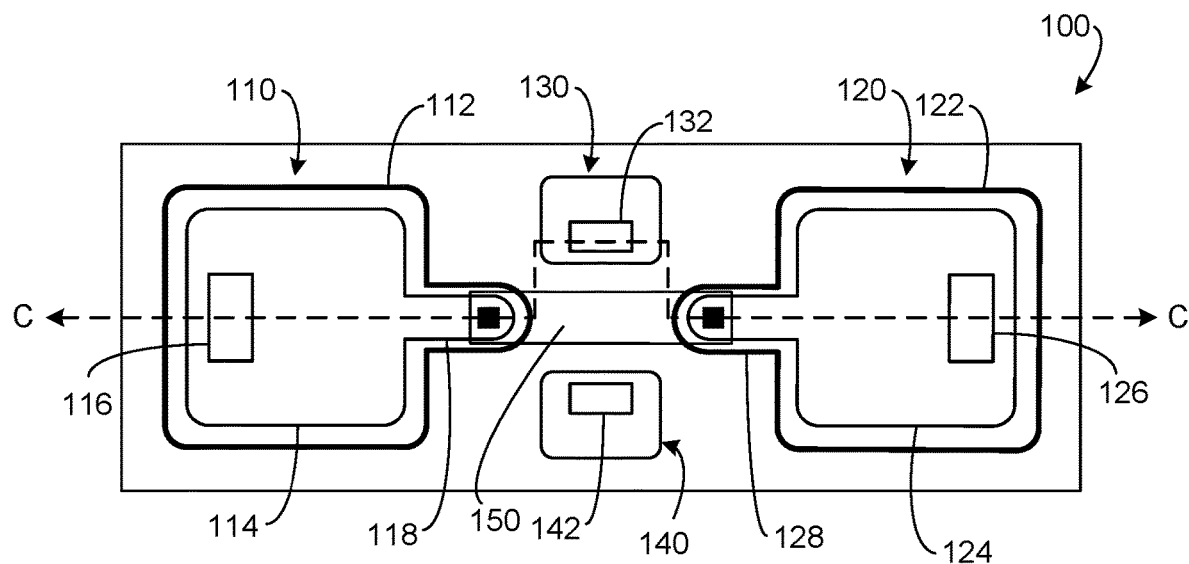
FIG. 1A is a block diagram schematically illustrating an electromagnetic interference (EMI) filter and electrostatic discharge (ESD)/electrical surge protection device.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols show in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of that element are illustrated.

DETAILED DESCRIPTION

In the following detailed description (and in the accompanying drawings) a number of example implementations of electromagnetic interference (EMI) filter and electrostatic discharge (ESD)/electrical surge protection devices (and their operation) are described and illustrated. The illustrated devices include a number of similar aspects, as well as a number of variations from one illustrated implementation to another. In the implementations disclosed herein, an EMI filter of such a device can include active, open-base bipolar transistors and electrical impedance elements (e.g., resistors, capacitors, and/or inductors) that provide for linear filtering of EMI that can occur as a result of radio frequency noise, as well as associated harmonics, that can be wirelessly coupled onto an associated data path and/or can occur due to non-linearity of the EMI filter, where the data path is configured to communicate digital information (data) associated with operation of a corresponding wireless communication device (e.g., a mobile phone, etc.), e.g., at frequencies that are more than an order of magnitude lower than radio frequencies. For instance, collector-to-base capacitances, base-to emitter capacitances and/or distributed capacitances of the electrical impedance elements can be adjusted to achieved desired EMI filtering (e.g., linearity and attenuation) performance.

In the example implementations described herein, the open-base bipolar transistors and electrical impedance elements can be included in (disposed in, etc.) respective isolation regions in a semiconductor device. In such approaches, the isolated open-base bipolar transistors and electrical impedance elements can, in addition to providing for EMI filtering, prevent damage to the EMI filter device from ESD and/or electrical surge (e.g., over-current and/or overvoltage) events. As noted above, EMI filtering performance of example implementations can be tuned by adjusting junction capacitances of the open-base bipolar transistors and/or distributed capacitances of the electrical impedance elements, e.g., by adjusting doping concentrations, and/or adjusting layout and sizing of the circuit elements of the EMI filter, and so forth. EMI filter performance can also be adjusted (tuned) by adjusting impedances of impedance elements included in the EMI filter (e.g., using similar techniques as those for adjusting capacitances).

In the examples described herein, one or more aspects of one implementation can be likewise implemented in one or more other implementations. For instance, arrangement and relative sizes of implants, specific circuit elements, etc., shown in one example implementation could also be implemented in other implementations. In some implementations, circuit elements (e.g., transistors, resistors, capacitors, inductors) can be added to, substituted for, or removed.

Additionally, example devices and circuits are described herein as being implemented with specific conductivity types (e.g., n-type or p-type) for specific implants and/or regions (e.g., diffusion regions). The doping concentrations of each of these implants and/or regions can vary based on the particular implementation. For purposes of illustration, and by way of example, in certain instances, qualitative examples of doping concentration (e.g., lightly doped, heavily doped, very-heavily doped, and so forth) are given. In the described examples, these qualitative indications of doping concentration are relative. That is, as used herein, lightly doped indicates lower doping concentration than heavily doped, while heavily doped indicates lower doping concentration than very-heavily doped. Specific, quantitative doping concentrations associated with these qualitative doping concentrations can vary based on the particular implementation. Further, in some implementations, the conductivity types of the various regions described herein can be inverted. That is, regions of the example devices described as being n-type can be implemented as p-type, and regions described as being p-type can be implemented as n-type, NPN transistors can be implemented as PNP transistors, etc.

FIG. 1A is a block diagram schematically illustrating an example EMI filter and ESD/electrical surge protection device (e.g., device 100). As shown in FIG. 1A, the device 100 includes an isolation region 110, an isolation region 120, an electrical ground region 130, an electrical ground region 140, and an electrical interconnection 150. In some implementations, portions of the device 100 can be replicated and/or mirrored to create devices that implement higher order filters, such as the examples shown in FIGS. 3A to 3C.

As shown in FIG. 1A, the isolation region 110 is defined by an isolation trench 112, which can be a dielectric filled trench. Similarly, the isolation region 120 is defined by an isolation trench 122, which can also be a dielectric filled trench. The device 100 can include circuit elements that are respectively implemented in the isolation region 110 and the isolation region 120. In implementations, these circuit elements can be configured to implement an EMI filter circuit, as well as to provide ESD and electrical surge protection for the device 100. For instance, as shown in FIG. 1A, a transistor 114 (e.g., a vertical, bipolar transistor) and an electrical impedance element 118 can be implemented in the isolation region 110, while a transistor 124 (e.g., a vertical, bipolar transistor) and an electrical impedance element 128 can be implemented in the isolation region 120. A signal pad (e.g., an input terminal 116) of the corresponding EMI filter circuit can also be included in the isolation region 110, while a signal pad (e.g., an output terminal 126) of the corresponding EMI filter circuit can be included in the isolation region 120. In implementations, the electrical impedance element 118 and the electrical impedance element 128 can respectively include resistors, inductors and/or capacitors, such as in the examples described herein. The specific circuit elements of the device 100 will depend on the particular implementation.

In the device 100, the ground region 130 and the ground region 140 (which are both outside the isolation region 110 and outside the isolation region 120) can each include a plurality of conductive trenches, e.g., arrays of trenches filled with an electrically conductive material, such as tungsten. The conductive trenches, such as those illustrated in FIG. 2, can electrically couple, respectively, an electrical ground terminal 132 (e.g., signal pad) of the electrical ground region 130 and an electrical ground terminal 142 (e.g., signal pad) of the electrical ground region 140 with a semiconductor substrate of the device 100. That is, such conductive trenches can provide low resistance, and low inductance electrical connections from the electrical ground terminal 132 and the electrical ground terminal 142 to an associated semiconductor substrate, so as to reduce adverse impacts on linearity and attenuation performance of the corresponding EMI filter circuit due to electrical impedance (e.g., resistance and inductance) of the electrical ground connections. As also shown in FIG. 1A, the electrical interconnection 150, in this example, electrically couples the electrical impedance element 118 with the electrical impedance element 128.

Figure 2:
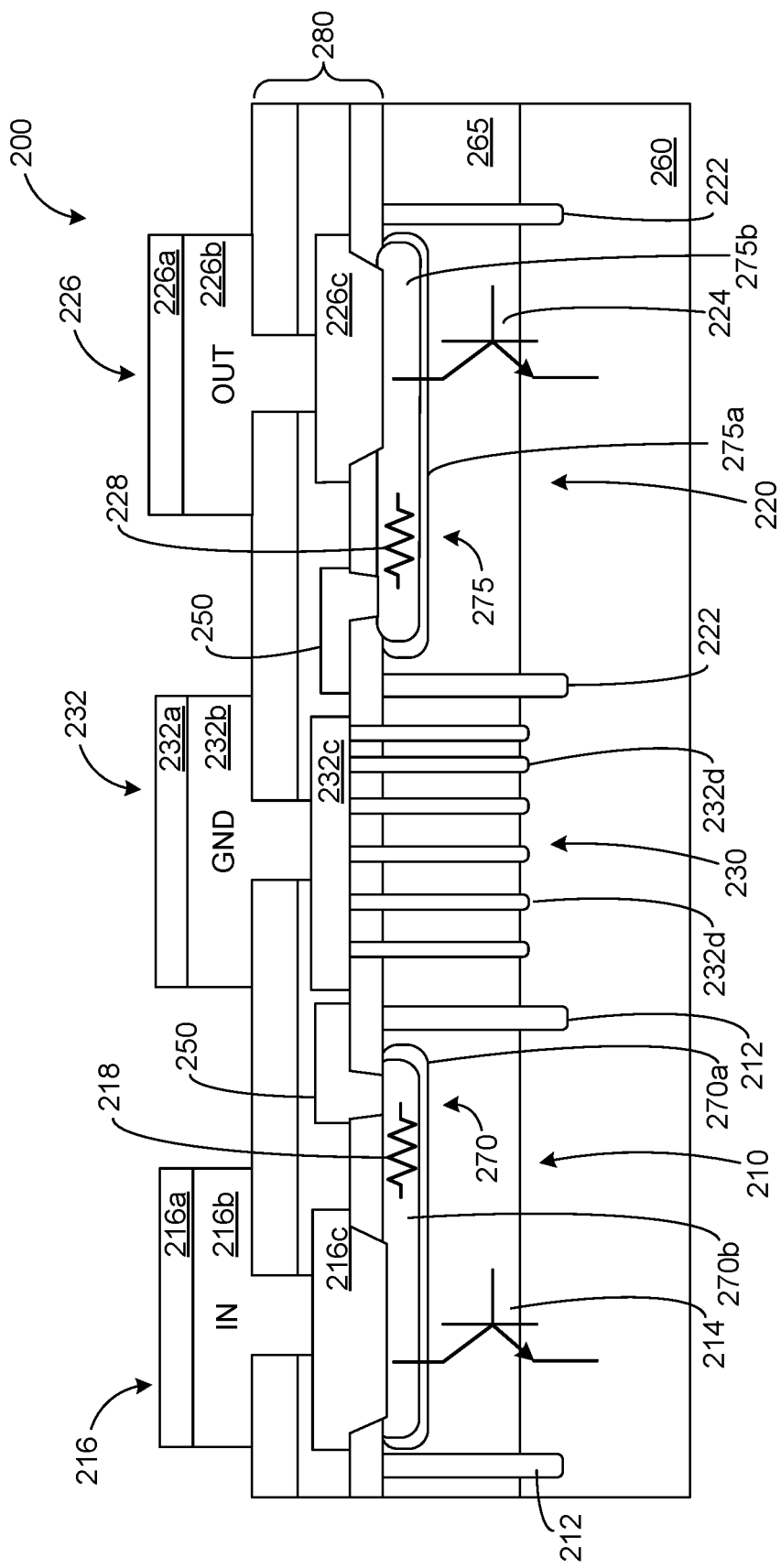
FIG. 2 is a diagram illustrating a cross-sectional view of an implementation of the circuit of FIG. 1B in the device of FIG. 1A.

FIG. 1A also includes a section line C-C, which corresponds with the cross-sectional view shown in FIG. 2. As shown in FIG. 1A, the section line C-C extends through the isolation region 110, through the electrical ground region 130, and through the isolation region 120. That is, the section line C-C is not a straight line, such that the isolation region 110, the electrical ground region 130 and the isolation region 120 of the device 100 (and their corresponding regions in FIG. 2) are included the cross-section defined by the section line C-C.

Figure 1B:
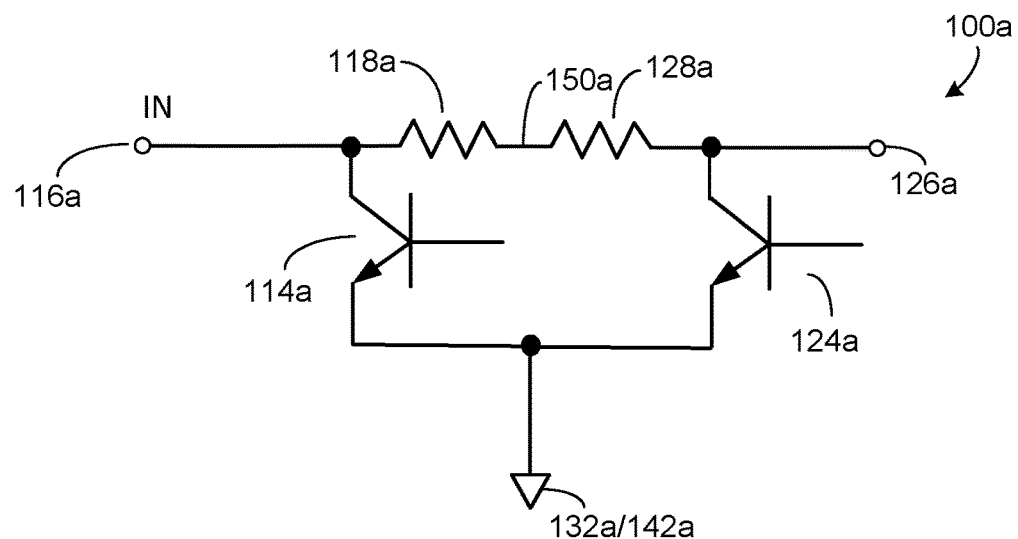
FIG. 1B is a schematic diagram illustrating a circuit that can be implemented in the device of FIG. 1A.

FIG. 1B is a schematic diagram illustrating an EMI filter and electrostatic ESD/electrical surge protection circuit (circuit 100a) that can be implemented in the device 100 of FIG. 1A. For purposes of illustration, elements of the circuit 100a corresponding with elements of the device 100 are referenced with like 100 series reference numbers suffixed with the letter 'a.' In other implementations, elements of the circuit 100a can be replaced with other elements, additional elements can be added, and/or elements can be removed.

In the example of FIG. 1B, the circuit 100a includes an open-base bipolar transistor 114a, and an open-base bipolar transistor 124a. For instance, in the circuit 100a, respective base terminals of the open-base bipolar transistor 114a and the open-base bipolar transistor 124a can be electrically floating. Further in the circuit 100a, an input terminal 116a can be electrically coupled with a collector terminal of the open-base bipolar transistor 114a, while an output terminal 126a can be electrically coupled with a collector terminal of the open-base bipolar transistor 124a. Also in the circuit 100a, a resistor 118a and a resistor 128a can be electrically coupled in series between the input terminal 116a and the output terminal 126a, where the resistor 118a is electrically coupled with the resistor 128a via an electrical connector 150a. As shown in FIG. 1B, respective emitter terminals of the open-base bipolar transistor 114a and the open-base bipolar transistor 124a are electrically coupled with an electrical ground terminal 132a/142a (corresponding with the electrical ground terminal 132 and the electrical ground terminal 142 of the device 100).

In this example, the circuit 100a implements a capacitive-resistive-capacitive (CRC) EMI filter. For instance, junction capacitances (e.g., collector-to-base and base-to-emitter capacitances) of the open-base bipolar transistor 114a and the open-base bipolar transistor 124a can provide capacitive elements of the EMI filter, while the resistor 118a and the resistor 128a can provide resistive elements of the EMI filter. Further, in implementations where the resistor 118a and the resistor 128a are implemented as diffusion resistors, respective distributed junction capacitances of the resistor 118a and the resistor 128a can also provide additional capacitive elements of the EMI filter of the circuit 100a. Desired EMI filtering performance (e.g., cutoff frequency, linearity, attenuation, etc.) of the 100a can be achieved by adjusting, respectively, capacitance and/or resistance of these elements. For instance, in semiconductor device (e.g., integrated circuit) implementations of the circuit 100a, capacitance and/or resistance can be adjusted (tuned) through layout, including sizing, relative doping concentrations, etc. of the elements of the circuit 100a. Additional aspects of EMI filtering by an example implementation of the circuit 100a (e.g., the implementation of FIG. 2) are further described below with respect to, at least, FIG. 5.

Further in the example of FIG. 1B, the open-base bipolar transistor 114a, the open-base bipolar transistor 124a, the resistor 118a, and the resistor 128a, in addition to implementing EMI filtering, can also protect the circuit 100a from damage associated with ESD and/or electrical surge events. For instance, in response to an ESD or electrical surge event, the open-base bipolar transistor 114a, and/or the open-base bipolar transistor 124a can act as a voltage clamp (e.g., at an associated breakdown voltage), and shunt a majority of current associated with the ESD or electrical surge event to the electrical ground terminal 132a/142a. In this example, any residual current associated with the ESD or electrical surge event can be conducted via the resistor 118a and the resistor 128a, e.g., at a current density below a level that can damage the resistor 118a or the resistor 128a. Additional aspects of the operation of an example implementation of the circuit 100a (e.g., the implementation of FIG. 2) during an ESD or electric surge event are further described below with respect to, at least, FIG. 4.

FIG. 2 is a diagram illustrating a cross-sectional view of an EMI filter and electrostatic ESD/electrical surge protection device (device 200), which is an example implementation of the circuit 100a of FIG. 1B in the device 100a of FIG. 1A. As discussed above, the cross-sectional view of the device 200 in FIG. 2 corresponds with the section line C-C in FIG. 1A. As shown in FIG. 2, the device 200 includes a very-heavily doped (e.g., n-type) substrate 260, and a lightly doped (e.g., p-type) semiconductor layer 265 disposed on the substrate 260. In some implementations, the semiconductor layer 265 can be an epitaxial semiconductor layer formed on the substrate 260. The device 200 also includes a plurality of dielectric layers 280 that are used as inter-layer dielectrics, e.g., for forming, or defining electrical contacts with circuit elements of the device 200. In some implementations, the dielectric layers 280 can include passivation layers, polyimide layers, oxide layers, etc.

For purposes of illustration and comparison with FIGS. 1A and 1B, elements of the device 200 corresponding with elements of the device 100 and/or the circuit 100a, are referenced with like 200 series reference numbers. For instance, the device 200 includes an isolation region 210, an input terminal 216 (of an EMI filter circuit of the device 200), an isolation region 220, an output terminal 226 (of the EMI filter circuit), a ground region 230, a ground terminal 232, and an electrical connector 250.

As shown in FIG. 2, the isolation region 210 is defined by an isolation trench 212, while the isolation region 220 is defined by an isolation trench 222. The isolation trench 212 and the isolation trench 222 can be dielectric-filled (e.g., oxide-filled) trenches. As shown in FIG. 2, the isolation trench 212 and the isolation trench 222 can each extend from a surface of the semiconductor layer 265, through the semiconductor layer 265 and terminate in the substrate 260. That is, the isolation trench 212 can isolate (electrically isolate) a portion of the semiconductor layer 265 within the isolation region 210 from portions of the semiconductor layer 265 outside the isolation region 210. Likewise, the isolation trench 222 can isolate a portion of the semiconductor layer 265 within the isolation region 220 from portions of the semiconductor layer 265 outside the isolation region 220.

In this example, the device 200 includes, within the isolation region 210, a diffusion region 270 (e.g., an n-type diffusion), and, within the isolation region 220, a diffusion region 275 (e.g., an n-type diffusion). The diffusion region 270 includes a region 270a disposed in the semiconductor layer 265, which can be a heavily-doped n-type region, and a region 270b disposed in the region 270a, which can be a very heavily-doped n-type region. Likewise, the diffusion region 275 includes a region 275a disposed in the semiconductor layer 265, which can be a heavily-doped n-type region (N+), and a region 275b disposed in the region 275a, which can be a very heavily-doped n-type region (N++). In some implementations, the diffusion region 270 and the diffusion region 275 (and their respective regions) can be formed using ion implantation processes, or other semiconductor doping processes, such as well formation processes.

As shown in FIG. 2, an open-base bipolar transistor 214 (NPN transistor) is defined by the diffusion region 270, the portion of the semiconductor layer 265 within the isolation region 210, and the substrate 260. That is, a collector terminal of the open-base bipolar transistor 214 is included in the diffusion region 270, a base terminal of the open-base bipolar transistor 214 is included in the portion of the semiconductor layer 265 within the isolation region 210, and an emitter terminal of the open-base bipolar transistor 214 is included in the substrate 260. Similarly, an open-base bipolar transistor 224 (NPN transistor) is defined by the diffusion region 275, the portion of the semiconductor layer 265 within the isolation region 220, and the substrate 260. That is, a collector terminal of the open-base bipolar transistor 224 is included in the diffusion region 275, a base terminal of the open-base bipolar transistor 224 is included in the portion of the semiconductor layer 265 within the isolation region 220, and an emitter terminal of the open-base bipolar transistor 224 is included in the substrate 260.

In the device 200, a resistor 218 (diffusion resistor) is included in the diffusion region 270, while resistor 228 (diffusion resistor) is included in the diffusion region 275. That is, in this example, the diffusion region 270 includes (defines) the collector terminal of the open-base bipolar transistor 214 and the resistor 218, while the diffusion region 275 includes (defines) the collector terminal of the open-base bipolar transistor 224 and the resistor 228. In this example, the resistor 218 is electrically coupled in series with the resistor 228 (e.g., between the input terminal 216 and the output terminal 226) via the electrical connector 250, though that connection is not specifically shown in FIG. 2 due to the path of the section line C-C of FIG. 1A used to define the illustrated cross-sectional view of the device 200.

As illustrated in FIG. 2, the input terminal 216 includes a metal layer 216a, a metal layer 216b and a metal layer 216c to form an electrical connection to the diffusion region 270 (e.g., to the collector of the open-base bipolar transistor 214 and the resistor 218). Further in the device 200, the output terminal 226 includes a metal layer 226a, a metal layer 226b and a metal layer 226c to form an electrical connection to the diffusion region 275 (e.g., to the collector of the open-base bipolar transistor 224 and the resistor 228). The ground terminal 232 includes a metal layer 232a, a metal layer 232b and metal layer 232c, where the ground terminal 232 is electrically coupled with the substrate 260 (and a portion of the semiconductor layer 265 outside the isolation region 210 and outside the isolation region 220) via conductive trenches 232d. In some implementations, the metal layers 216a, 226a and 232a can include a tin-based solder material; the metal layers 216b, 226b and 232b can include copper; and the metal layers 216c, 226c and 232c can include an aluminum-copper alloy. In other implementations, other materials can be used for the metal layers, and fewer, or more metal layers can be included. As shown in FIG. 2, the conductive trenches 232d can extend through a portion of the dielectric layers 280, through a surface of the 265, through the semiconductor layer 265, and terminate in the substrate 260.

Figure 3A:
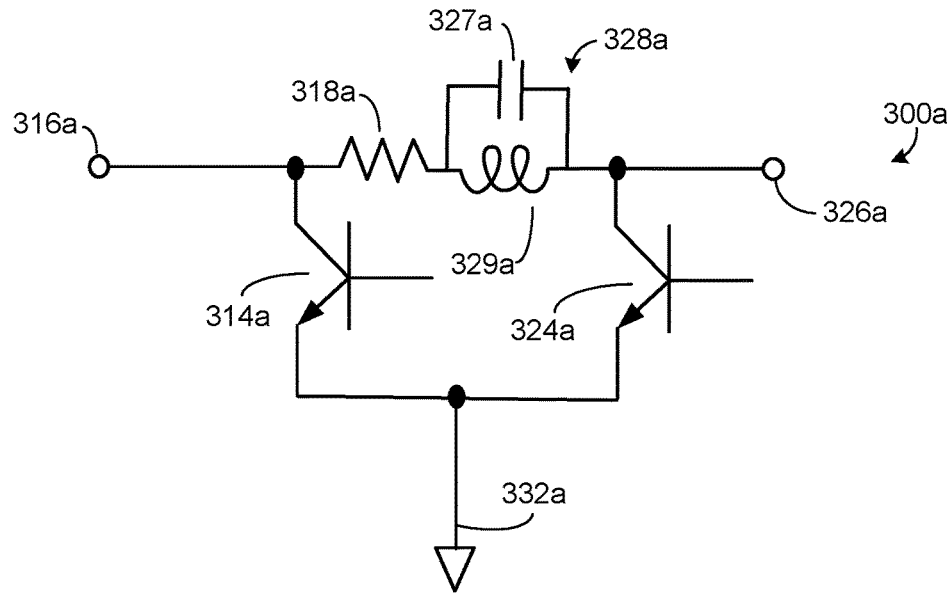
FIGS. 3A through 3C are schematic diagrams of circuits that can be implemented, e.g., in the device of FIG. 1A, or variations of the device of FIG. 1A.
Figure 3B:
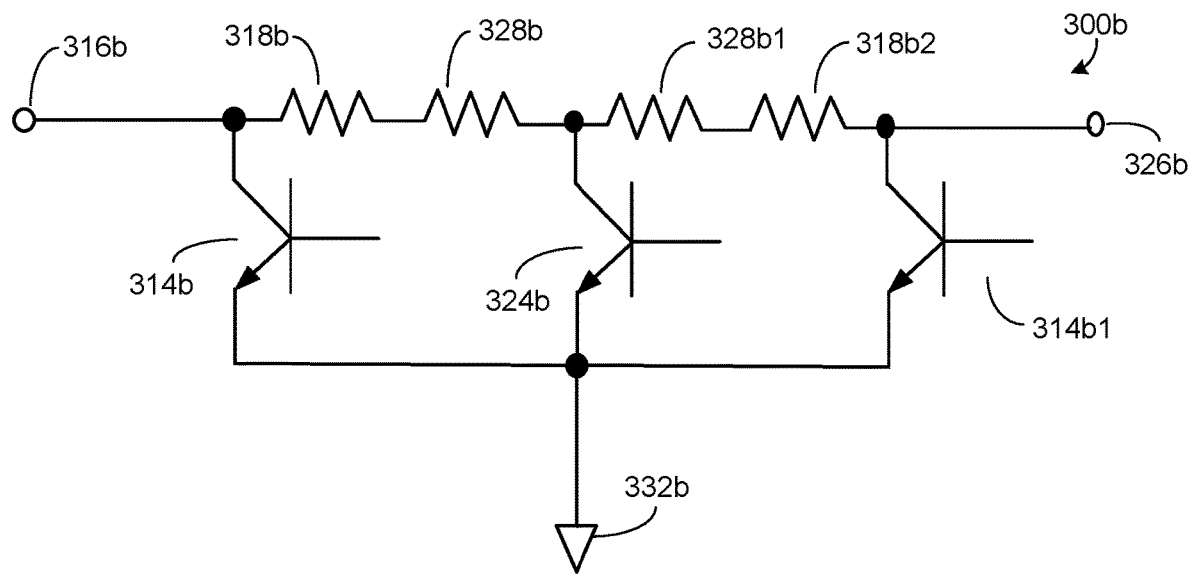
Figure 3C:
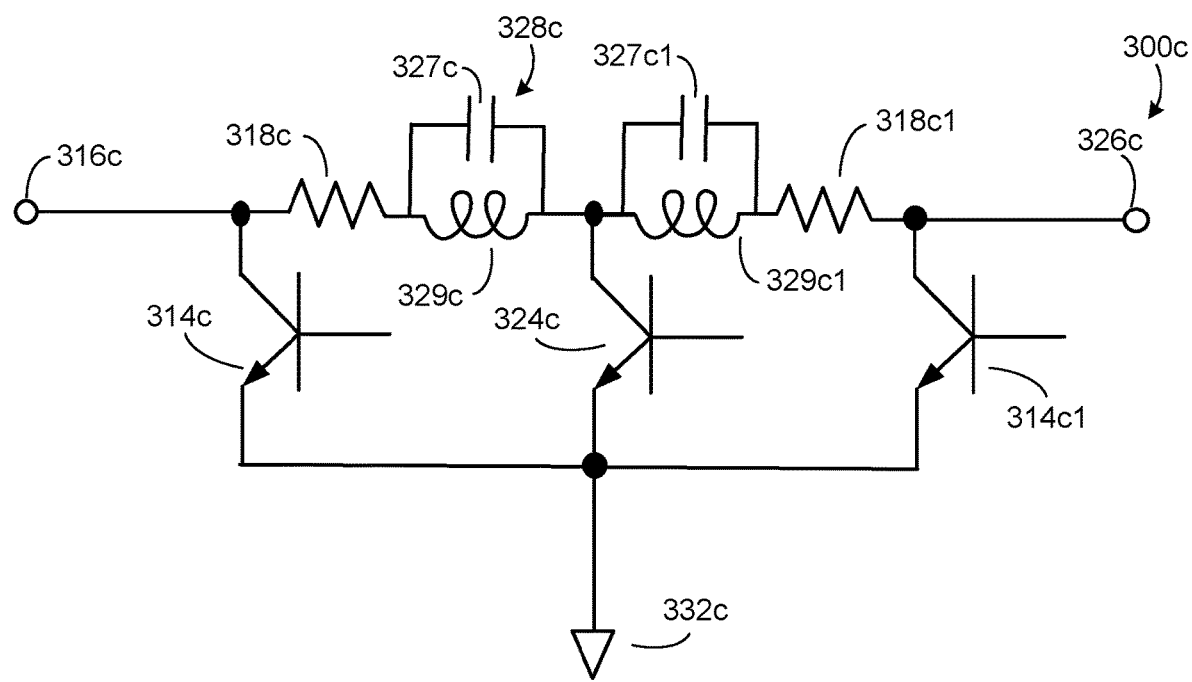

FIGS. 3A through 3C are schematic diagrams of circuits that can be implemented, e.g., in the device of FIG. 1A, or variations of the device of FIG. 1A. The circuits of FIGS. 3A to 3C implement higher order EMI filters than the EMI filter of the circuit 100a. Specifically, FIG. 3A illustrates a circuit 300 implementing a capacitive-resistive-inductive-capacitive (CRLC) filter, FIG. 3B illustrates a circuit 300b implementing a CRCRC filter, and FIG. 3C illustrates a circuit 300c implementing a CRLC filter. As with the other example implementations described herein, junction capacitances of elements of the circuits in FIGS. 3A to 3B (e.g., of open-base bipolar transistors and/or impedance elements) can be adjusted to tune performance of the associated EMI filters. Also, respective values of impedance elements (e.g., resistances, inductances and/or capacitances) can also be adjusted to tune performance of the corresponding EMI filters.

Referring to FIG. 3A, the circuit 300a includes an open-base bipolar transistor 314a, and an open-base bipolar transistor 324a. In the circuit 300a, respective base terminals of the open-base bipolar transistor 314a and the open-base bipolar transistor 324a can be electrically floating. Further in the circuit 300a, an input terminal 316a can be electrically coupled with a collector terminal of the open-base bipolar transistor 314a, while an output terminal 326a can be electrically coupled with a collector terminal of the open-base bipolar transistor 324a. In the circuit 300a, impedance elements of the EMI filter include a resistor 318a and an inductive-capacitive (LC) circuit (LC circuit 328a), which are electrically coupled in series between the input terminal 316a and the output terminal 326a. The LC circuit 328a includes a capacitor 327a that is electrically coupled in parallel with an inductor 329a. As shown in FIG. 3A, respective emitter terminals of the open-base bipolar transistor 314a and the open-base bipolar transistor 324a are electrically coupled with an electrical ground terminal 332a (corresponding with the electrical ground terminal 132 and the electrical ground terminal 142 of the device 100). In the circuit 300a, the open-base bipolar transistor 314a and the resistor 318a can be included in a first isolation region, while the open-base bipolar transistor 324a and the LC circuit 328a can be included in a second isolation region.

Referring to FIG. 3B, the circuit 300b includes an open-base bipolar transistor 314b, an open-base bipolar transistor 324b, and an open-base bipolar transistor 314b1. In the circuit 300b, respective base terminals of the open-base bipolar transistor 314b, the open-base bipolar transistor 324b, and the open-base bipolar transistor 314b1 can be electrically floating. Further in the circuit 300b, an input terminal 316b can be electrically coupled with a collector terminal of the open-base bipolar transistor 314b, and an output terminal 326b can be electrically coupled with a collector terminal of the open-base bipolar transistor 314b1. In the circuit 300a, impedance elements of the EMI filter include a resistor 318b, a resistor 328b, a resistor 328b1, and a resistor 318b1, which are electrically coupled in series between the input terminal 316b and the output terminal 326b. A collector terminal of the open-base bipolar transistor 324b can be electrically coupled between the resistor 328b and the resistor 328b1.

As shown in FIG. 3B, respective emitter terminals of the open-base bipolar transistor 314b, the open-base bipolar transistor 324b, and the open-base bipolar transistor 324b1 are electrically coupled with an electrical ground terminal 332b (corresponding with the electrical ground terminal 132 and the electrical ground terminal 142 of the device 100). In the circuit 300b, the open-base bipolar transistor 314b and the resistor 318b can be included in a first isolation region. The open-base bipolar transistor 324b, the resistor 328b, and the resistor 328b1 can be included in a second isolation region. The open-base bipolar transistor 314b1 and the resistor 318b1 can be included in a third isolation region.

Referring to FIG. 3C, the circuit 300c includes an open-base bipolar transistor 314c, an open-base bipolar transistor 324c, and an open-base bipolar transistor 314c1. In the circuit 300c, respective base terminals of the open-base bipolar transistor 314c, the open-base bipolar transistor 324c, and the open-base bipolar transistor 314c1 can be electrically floating. Further in the circuit 300c, an input terminal 316c can be electrically coupled with a collector terminal of the open-base bipolar transistor 314c, and an output terminal 326c can be electrically coupled with a collector terminal of the open-base bipolar transistor 314c1. In the circuit 300a, impedance elements of the EMI filter include a resistor 318c, an LC circuit 328c, an LC circuit 328c1, and a resistor 318c1, which are electrically coupled in series between the input terminal 316c and the output terminal 326c. A collector terminal of the open-base bipolar transistor 324c can be electrically coupled between the LC circuit 328c and the LC circuit 328c1. The LC circuit 328c includes a capacitor 327c electrically coupled in parallel with an inductor 329c, while the LC circuit 328c1 includes a capacitor 327c1 electrically coupled in parallel with an inductor 329c1.

As shown in FIG. 3C, respective emitter terminals of the open-base bipolar transistor 314c, the open-base bipolar transistor 324c, and the open-base bipolar transistor 314c1 are electrically coupled with an electrical ground terminal 332c (corresponding with the electrical ground terminal 132 and the electrical ground terminal 142 of the device 100). In the circuit 300c, the open-base bipolar transistor 314c and the resistor 318c can be included in a first isolation region. The open-base bipolar transistor 324c, the LC circuit 328c, and the LC circuit 328c1 can be included in a second isolation region. The open-base bipolar transistor 314c1 and the resistor 318c1 can be included in a third isolation region.

Figure 4:
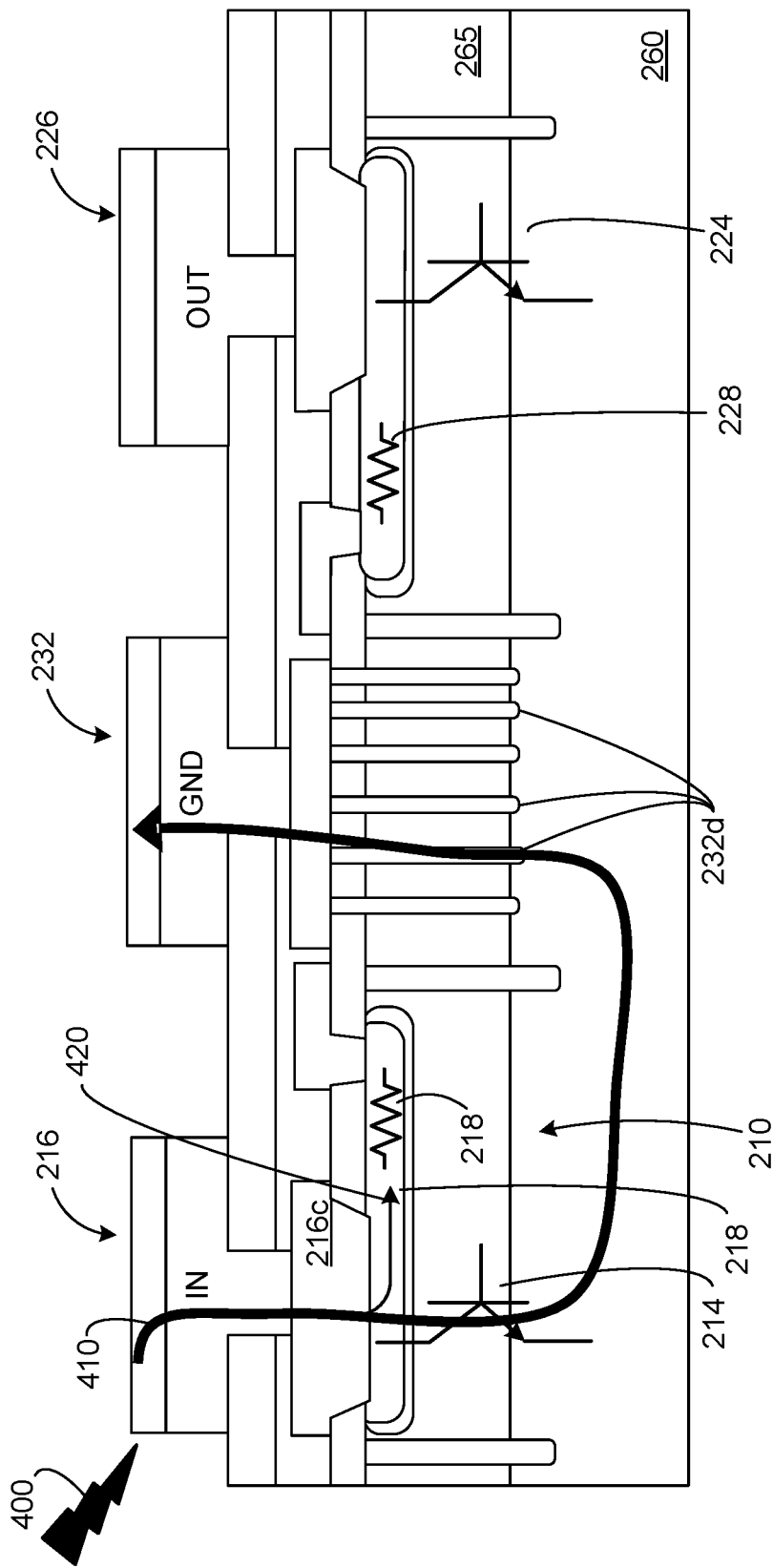
FIG. 4 is a diagram illustrating operation of the device of FIG. 2 during an ESD (or electrical surge) event.

FIG. 4 is a diagram illustrating operation of the device 200 of FIG. 2 (e.g., the circuit 100a) during an electrostatic discharge (or electrical surge) event 400 occurring on the input terminal 216. FIG. 4 is given by way of example, and the device 200 can operate similarly in response to other ESD or electrical surge events, such as events occurring on the output terminal 226, where the 224 can act as a voltage clamp.

As shown in FIG. 4, in response to the event 400 on the input terminal 216, the 214 can act a voltage clamp and conduct a current 410 associated with the event 400, which can be a majority of the current associated with the event 400. The current 410, in this example can be conducted from the input terminal 216, through the open-base bipolar transistor 214 (operating in breakdown), through the substrate 260, and to the ground terminal 232 through the conductive trenches 232d. As also shown in FIG. 4, a residual current 420 associated with the event 400 can be conducted by the resistor 218 (and the resistor 228). In this example, because the open-base bipolar transistor 214 acts as a voltage clamp, the open-base bipolar transistor 214 and the resistor 218 are included in the isolation region 210, and there is a low resistance, and low inductance conductive path to the ground terminal 232, current (current 410 and current 420) from the event 400 can be efficiently conducted, preventing damage to the device.

In some implementations, clamping voltage of an open-base bipolar (such as those described herein) in response to an ESD or electrical surge event can be adjusted based on design and/or processing parameters. For instance, in described implementations, clamping voltage of an open-base bipolar depends on a breakdown voltage ($V_{br}$) of the open-base bipolar and current through the open-base bipolar. Thus by adjusting $V_{br}$ of the open-base bipolar, e.g., to a value greater than an upper operating voltage limit, as well as adjusting dynamic resistance ($R_{dyn}$), e.g., by varying a size of the open base-bipolar and/or process, a desired clamping voltage ($V_{clamp}$) can be achieved, where is given by $V_{clamp}=R_{dyn}*I$, and I is a current conducted through the open-base bipolar, e.g., a current associated with a given ESD or electrical surge event.

Figure 5:
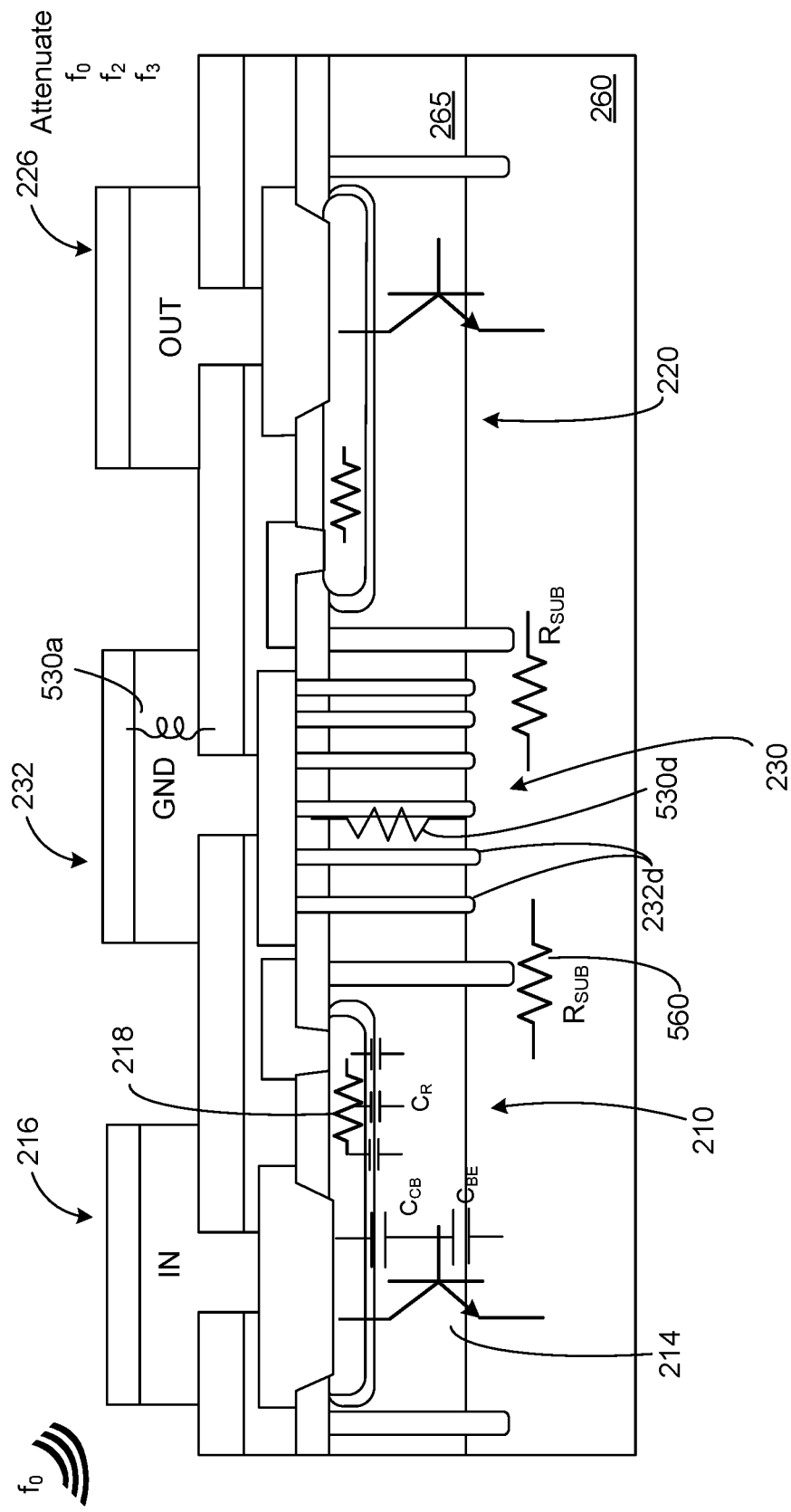
FIG. 5 is a diagram illustrating aspects of the device of FIG. 2 for filtering EMI.

FIG. 5 is a diagram illustrating aspects of the device 200 of FIG. 2 (e.g., the circuit 100a) for filtering EMI. In the example of FIG. 5, circuit elements of the device 200 within the isolation region 210 are described by way of example. For purposes of brevity, like circuit elements within the isolation region 220 are not described herein, as those elements can implement aspects for implementing EMI filtering that correspond with the aspects described below with respect to the circuit elements included in the isolation region 210.

As shown in FIG. 5, junction capacitances of the open-base bipolar transistor 214 can be included in an EMI filter of the device 200. These junction capacitances can include a collector-to-base capacitance ($C_{CB}$) of the open-base bipolar transistor 214, and a base-to-emitter capacitance ($C_{BE}$) of the open-base bipolar transistor 214. Additionally, distributed junction capacitance ($C_R$) of the resistor 218 can also be included in the EMI filter. In implementations, $C_{CB}$, $C_{BE}$, and $C_R$ can be adjusted (e.g., by layout, sizing, doping concentrations, etc.) to achieve desired linearity of the associated EMI filter. For instance, these capacitances can be adjusted such that they are symmetrical, where the combined capacitance of $C_{CB}$ and $C_R$ matches (is equal to, or approximately equal to) $C_{BE}$. Such an approach can provide linear operation of the associated EMI filter, which allows for attenuation of a fundamental RF frequency ($f_0$) that can be coupled (via EMI) onto a data path of the device (e.g., between the input terminal 216 and the 226), as well attenuation harmonics of $f_0$. Such harmonics can include a second harmonic ($f_2$) and a third harmonic ($f_3$).

Operation of the EMI filter can also be tuned by adjusting a relationship between capacitances (e.g, $C_{CB}$, $C_{BE}$, and $C_R$) and impedances (e.g., resistance of the resistor 218 and the resistor 228), such as to achieve a desired cutoff frequency of the EMI filter. Also, low resistance and low inductance of the electrical ground connection (e.g., between the substrate 260 and the ground terminal 232) can be achieved due to the very-high doping concentration of the substrate 260 providing a low resistance (represented as $R_{SUB}$ 560) of the substrate 260, as well as low resistance and low inductance of the conductive trenches 232d and the ground terminal 232 (represented as inductor 530a). In some implementations, a cutoff frequency of 65 megahertz (MHz) (above a data rate for digital data communicated by the EMI filter) can be achieved. Further, attenuation of $f_0$ (e.g., greater than 700 MHz) of at least 40 decibel (dB), filtering of $f_2$ (e.g., greater than 1.4 gigahertz (GHz)) of at least −85 dBm, and filtering of $f_3$ (e.g., greater than 2.1 GHz) of at least −110 dBm can be achieved.

The various apparatus and techniques described herein may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An electromagnetic interference (EMI) filter circuit comprising:
    an input terminal;
    an output terminal;
    an electrical ground terminal;
    a diffusion resistor electrically coupled between the input terminal and the output terminal, the diffusion resistor including at least one diffusion region;
    a first bipolar transistor including:
        a collector terminal electrically coupled with the input terminal, the collector terminal being included in the at least one diffusion region of the diffusion resistor;
        an emitter terminal electrically coupled with the electrical ground terminal; and
        a base terminal that is electrically floating; and
    a second bipolar transistor including:
        a collector terminal electrically coupled with the output terminal;
        an emitter terminal electrically coupled with the electrical ground terminal; and
        a base terminal that is electrically floating.

2. The EMI filter circuit of claim 1, wherein the diffusion resistor is a first resistor, the EMI filter circuit further comprising:
    a second resistor electrically coupled in series with the first resistor between the input terminal and the output terminal; and
    a third bipolar transistor including:
        a collector terminal electrically coupled between the first resistor and the second resistor;
        an emitter terminal electrically coupled with the electrical ground terminal; and
        a base terminal that is electrically floating.

3. The EMI filter circuit of claim 2, wherein:
    the EMI filter circuit is included in a semiconductor device;
    the first bipolar transistor is a first vertical bipolar transistor;
    the second bipolar transistor is a second vertical bipolar transistor; and
    the third bipolar transistor is a third vertical bipolar transistor.

4. The EMI filter circuit of claim 1, further comprising:
    an inductive-capacitive (LC) circuit including:
        an inductor; and
        a capacitor electrically coupled in parallel with the inductor,
    the LC circuit being electrically coupled in series with the diffusion resistor between the input terminal and the output terminal.

5. The EMI filter circuit of claim 4, wherein the diffusion resistor is a first resistor and the LC circuit is a first LC circuit, the EMI filter circuit further comprising:
    a second resistor; and
    a second LC circuit,
    the first resistor, the first LC circuit, the second LC circuit, and the second resistor being electrically coupled in series between the input terminal and the output terminal, the EMI filter circuit further comprising:
    a third bipolar transistor including:
        a collector terminal electrically coupled between the first LC circuit and the second LC circuit;
        an emitter terminal electrically coupled with the electrical ground terminal; and
        a base terminal that is electrically floating.

6. The EMI filter circuit of claim 1, wherein the diffusion resistor is a first resistor, the EMI filter circuit further comprising:
    a second resistor electrically coupled in series with the first resistor between the input terminal and the output terminal.

7. The EMI filter circuit of claim 6, wherein:
    the EMI filter circuit is included in a semiconductor device;
    the first bipolar transistor is a first vertical bipolar transistor;
    the second bipolar transistor is a second vertical bipolar transistor; and
    the second resistor is a second diffusion resistor.

8. A semiconductor device comprising:
    a substrate of a first conductivity type;
    a semiconductor layer of a second conductivity type that is opposite the first conductivity type;
    a first isolation region defined by a first trench;
    a first diffusion region of the first conductivity type disposed in the semiconductor layer in the first isolation region;
    a second isolation region defined by a second trench;
    a second diffusion region of the first conductivity type disposed in the semiconductor layer in the second isolation region;
    an electrical ground terminal disposed on the semiconductor layer outside the first isolation region and outside the second isolation region; and
    an electromagnetic interference (EMI) filter circuit including:
        an input terminal disposed on the semiconductor layer in the first isolation region;
        an output terminal disposed on the semiconductor layer in the second isolation region;
        a first electrical impedance element disposed in the first isolation region, the first electrical impedance element being a first diffusion resistor included in the first diffusion region;
        a second electrical impedance element disposed in the second isolation region, the first electrical impedance element and the second electrical impedance element being electrically coupled in series between the input terminal and the output terminal;
        a first vertical bipolar transistor disposed in the first isolation region, the first vertical bipolar transistor including:

a collector terminal electrically coupled with the input terminal, the collector terminal being included in the first diffusion region;
an emitter terminal electrically coupled with the electrical ground terminal; and
a base terminal that is electrically floating; and
a second vertical bipolar transistor disposed in the second isolation region, the second vertical bipolar transistor including:
a collector terminal electrically coupled with the output terminal;
an emitter terminal electrically coupled with the electrical ground terminal; and
a base terminal that is electrically floating.

9. The semiconductor device of claim 8, wherein:
the first trench extends from an upper surface of the semiconductor layer, through the semiconductor layer and terminates in the substrate, the first trench having a dielectric material disposed therein; and
the second trench extends from the upper surface of the semiconductor layer, through the semiconductor layer and terminates in the substrate, the second trench having the dielectric material disposed therein.

10. The semiconductor device of claim 8, wherein the electrical ground terminal is electrically coupled with the substrate via a plurality of trenches filled with an electrically conductive material.

11. The semiconductor device of claim 10, wherein the plurality of trenches filled with the electrically conductive material extend from a surface of the semiconductor layer, through the semiconductor layer and terminate in the substrate.

12. The semiconductor device of claim 8, wherein:
the second electrical impedance element is a second diffusion resistor included in the second diffusion region.

13. The semiconductor device of claim 12, wherein:
the base terminal of the first vertical bipolar transistor is included in the semiconductor layer;
the emitter terminal of the first vertical bipolar transistor is included in the substrate;
the collector terminal of the second vertical bipolar transistor is included in the second diffusion region;
the base terminal of the second vertical bipolar transistor is included in the semiconductor layer; and
the emitter terminal of the second vertical bipolar transistor is included in the substrate.

14. The semiconductor device of claim 8, wherein:
the second electrical impedance element is an inductive-capacitive (LC) circuit.

15. The semiconductor device of claim 8, wherein the first diffusion region includes:
a first region disposed in the semiconductor layer, the first region having a first doping concentration; and
a second region disposed in the first region, the second region having a second doping concentration that is greater than the first doping concentration.

16. The semiconductor device of claim 8, wherein:
the first conductivity type is n-type; and
the second conductivity type is p-type.

17. A method comprising:
receiving an electrical transient at one of an input terminal, an output terminal, or an electrical ground terminal of an electromagnetic interference (EMI) filter circuit;
clamping a voltage of the electrical transient with a vertical, open-base bipolar transistor of the EMI filter circuit;
conducting a first portion of a current of the electrical transient with the vertical, open-base bipolar transistor; and
conducting a second portion of the current of the electrical transient with an electrical impedance element of the EMI filter circuit, the second portion of the current being less than the first portion of the current, the electrical impedance element including at least one diffusion region that further includes a collector terminal of the vertical, open-base bipolar transistor,
the collector terminal of the vertical, open-base bipolar transistor being electrically coupled with one of the input terminal or the output terminal,
an emitter terminal of the vertical, open-base bipolar transistor being electrically coupled with the electrical ground terminal, and
the electrical impedance element being electrically coupled between the input terminal and the output terminal.

18. The method of claim 17, wherein the electrical transient is one of an electrostatic discharge (ESD) or an electrical surge.

19. The method of claim 17, wherein the electrical impedance element further includes an inductive-capacitive circuit.

20. The method of claim 17, wherein the vertical, open-base bipolar transistor and the electrical impedance element are included in an isolation region of the EMI filter circuit.

* * * * *